United States Patent
Sewiolo

(10) Patent No.: US 9,923,541 B2
(45) Date of Patent: Mar. 20, 2018

(54) CONVERTING A SYMMETRICAL INPUT SIGNAL OF A MAGNETIC RESONANCE ARRANGEMENT INTO AN ASYMMETRICAL OUTPUT SIGNAL

(71) Applicant: Benjamin Sewiolo, Obermichelbach (DE)

(72) Inventor: Benjamin Sewiolo, Obermichelbach (DE)

(73) Assignee: Siemens Aktiengesellschaft, München (DE)

(*) Notice: Subject to any disclaimer, the term of this patent is extended or adjusted under 35 U.S.C. 154(b) by 8 days.

(21) Appl. No.: 14/995,990

(22) Filed: Jan. 14, 2016

(65) Prior Publication Data
US 2016/0204756 A1    Jul. 14, 2016

(30) Foreign Application Priority Data
Jan. 14, 2015   (DE) .......................... 10 2015 200 429

(51) Int. Cl.
*H03H 7/46*    (2006.01)
*H03H 7/18*    (2006.01)
(Continued)

(52) U.S. Cl.
CPC ................ *H03H 7/18* (2013.01); *H03H 7/06* (2013.01); *H03H 7/42* (2013.01)

(58) Field of Classification Search
CPC ............. H03H 7/01; H03H 7/42; H03H 7/068
(Continued)

(56) References Cited

U.S. PATENT DOCUMENTS 6,052,039 A * 4/2000 Chiou .................... H03H 7/42
                                            333/100
7,330,085 B2 * 2/2008 Ezzeddine ............. H03H 7/42
                                             333/25
(Continued)

FOREIGN PATENT DOCUMENTS

DE      10104260 A1     8/2002
DE    102011005349 A1   9/2012
DE    102013209450 A1  11/2014

OTHER PUBLICATIONS

Bartlett A.C. et al: Boucherot's Constant-Current Networks and their Relation to Electric Wave Filters, Journal of the Institution of Electrical Engineers, Journal Paper, 1927, pp. 373-376.
(Continued)

*Primary Examiner* — Robert J Pascal
*Assistant Examiner* — Kimberly Glenn
(74) *Attorney, Agent, or Firm* — Lempia Summerfield Katz LLC

(57) ABSTRACT

A symmetrical input signal is converted into an asymmetrical output signal. A first conduction path and a second conduction path are arranged parallel to one another based on signal flow. The first conduction path and the second conduction path form a first stage and a second stage. The first conduction path includes a first high-pass element assigned to the first stage. The second conduction path includes a first low-pass element assigned to the first stage. The first conduction path and the second conduction path have a second high-pass element assigned to the second stage. The second conduction path includes a second low-pass element assigned to the second stage and arranged in a chain with the first low-pass element. Each high-pass ele-
(Continued)

ment shifts the phase of a signal forward, and each low-pass element shifts the phase of a signal backward to generate the asymmetrical signal.

17 Claims, 7 Drawing Sheets

(51) Int. Cl.
    *H03H 7/06*     (2006.01)
    *H03H 7/42*     (2006.01)

(58) Field of Classification Search
    USPC .......................................................... 333/132
    See application file for complete search history.

(56) References Cited

U.S. PATENT DOCUMENTS

| | | |
|---|---|---|
| 8,526,902 B2 | 9/2013 | Biber et al. |
| 2004/0169566 A1* | 9/2004 | Guitton .................. H03H 7/422 333/25 |
| 2013/0063221 A1 | 3/2013 | Biber et al. |
| 2014/0347143 A1 | 11/2014 | Oppelt |

OTHER PUBLICATIONS

German Office action for related German Application No. 10 2015 200 429.5, dated Sep. 23, 2015, with English Translation.
Meinke H. et al: Taschenbuch der Hochfrequenztechnik, Springer Verlag, vol. 3., 1968, pp. 1437-1438.

\* cited by examiner

CONVERTING A SYMMETRICAL INPUT SIGNAL OF A MAGNETIC RESONANCE ARRANGEMENT INTO AN ASYMMETRICAL OUTPUT SIGNAL

CROSS-REFERENCE TO RELATED APPLICATION

This application claims priority under 35 U.S.C § 119 to German Patent Application No. 102015200429.5, filed on Jan. 14, 2015, the entire content of which is incorporated herein by reference.

FIELD

The present embodiments relate to converting a symmetrical input signal of a magnetic resonance arrangement into an asymmetrical output signal.

BACKGROUND

Symmetrical or asymmetrical signals may be transmitted in various circuits. In this case, symmetrical signals are also understood as being "differential" or "balanced to ground" signals. Asymmetrical signals are also called "single ended" or "unbalanced to ground" signals.

For symmetrical signal routing, each conductor is assigned a second conductor of the same design (e.g., the two conductors occur in pairs and may be twisted with one another). The signals have a phase difference of 180°. Interference caused by radio signals or magnetic fields may then have virtually the same effect on both wires (e.g., common mode signal). The useful signal (e.g., push-pull signal) may be obtained in the receiver by determining the voltage difference between the two lines. During this determination, a common mode interference signal, equally present on both lines, emerges again. In contrast, irradiated interference affects only one conductor during asymmetrical transmission since the return conductor is the system ground. Therefore, the interference may not be removed by forming a 180° phase difference in the same manner.

Some applications may require conversion of symmetrical signals into asymmetrical signals or vice versa. For this purpose, as known from DE 101 04 260 A1, a Boucherot bridge, such as described in DE 102011005349 A1, the older German application 102013209450.7, or in H. Meinke, F. W. Gundlach: "Taschenbuch der Hochfrequenztechnik" [Pocket book of high-frequency technology], Springer Verlag, 3rd edition, 1968, pages 1437-1438, may be used.

Such a Boucherot bridge substantially consists of two discrete circuitry conduction paths, one path (e.g., high-pass branch) that effects a forward rotation in terms of phase by 90° and one path (e.g., low-pass branch) that effects a backward rotation in terms of phase by 90°. The conventional Boucherot bridge is generally used to generate a symmetrical signal from an asymmetrical signal or vice versa. However, the conventional Boucherot bridge is narrow-band since the voltages with respect to ground appearing at the output or input ports of the Boucherot bridge are exactly identical in magnitude at only a single frequency. Thus, the signals may be converted from symmetrical to asymmetrical or vice versa only in a narrow frequency range.

Some balancing applications require a broader frequency band. Broadband applications in magnetic resonance imaging (MRI), may use transformers (e.g., line transformers such as baluns) for circuits intended to be used for two or more field strengths. Thus, for example, two decades of bandwidth may be covered by wound cores of ferrite. Ferrites fail in magnetic fields (e.g., in the patient area of an MRI system) since ferrites saturate. Therefore, the transformer is composed of air-coupled windings. Such components are not usually customary on the market but are made to order and are therefore relatively expensive and difficult to produce.

SUMMARY AND DESCRIPTION

The present embodiments may obviate one or more of the drawbacks or limitations in the related art. For example, an apparatus and a method for converting a symmetrical input signal of a magnetic resonance arrangement into an asymmetrical output signal, in which conversion may be carried out with cost-effective components over a wide frequency range, are provided.

In the provided circuit (also referred to as an "apparatus") for converting a symmetrical input signal of a magnetic resonance arrangement into an asymmetrical output signal at the output of a digital/analog converter of the magnetic resonance device, at least one first conduction path and one second conduction path are connected downstream. The first conduction path and the second conduction path are arranged parallel to one another based on the signal flow and have a phase shift of 180°. The first conduction path and the second conduction path form a first stage. The first conduction path includes a high-pass element assigned to the first stage. The second conduction path includes a low-pass element assigned to the first stage. These elements are arranged in a chain. The first conduction path and the second conduction path form a second stage. A high-pass element is assigned to the second stage and is arranged in a chain with the high-pass element assigned to the first stage. The second conduction path includes a low-pass element assigned to the second stage and arranged in a chain with the low-pass element assigned to the first stage. Each high-pass element shifts the phase of a signal forward by a predetermined magnitude, and each low-pass element shifts the phase of a signal backward by a predetermined magnitude in order to generate an asymmetrical signal. The sum of the phase shifts in the first conduction path is approximately +90°, and the sum of the phase shifts in the second conduction path is approximately −90°. Two inputs for receiving a symmetrical signal are connected downstream of the output of the digital/analog converter such that a first input is assigned to the first conduction path and a second input is assigned to the second conduction path. An output for outputting an asymmetrical signal is formed such that the first and second conduction paths are coupled on the output side.

An unbalancing circuit may be provided with the aid of at least one single-stage arrangement of the conduction paths. Conventional components may be used in this case. The unbalancing circuit may therefore be constructed without ferrites. In this manner, the unbalancing circuit may also be used in applications which should be ferrite-free (e.g., a patient area of a magnetic resonance scanner).

In the stage, the phase of a signal is shifted forward (e.g., in the leading direction) by a particular magnitude in the first conduction path and is shifted backward (e.g., in the lagging direction) by a particular magnitude in the second conduction path.

The division into two conduction paths converts the signal from the digital/analog converter from asymmetrical to symmetrical. At the same time, an impedance conversion may take place, converting an impedance of the input signal into another impedance for the output signal.

The first conduction path has two high-pass elements. Each high-pass element acts as a discrete high-pass conduction element and shifts the phase of the signal forward as a result. In contrast, the second conduction path has two low-pass elements. Each low-pass element acts as a discrete low-pass conduction element and shifts the phase of the signal backward as a result. The sum of the phase shift for each conduction path is approximately +/−90°. Dividing the phase shift among two or more stages (e.g., two) achieves a wider bandwidth with simple components. The sum of the phase shift for each conduction path depends on the respective frequency of the signal. Depending on the frequency, the phase shift achieved is somewhat below +/−90° or somewhat above +/−90°. In other words, the phase shift approaches +/−90°. The sum of the phase shift may be +90° or −90° for each conduction path.

A symmetrical input signal (e.g., via two inputs or two ports) is received, and an asymmetrical output signal (e.g., via one output or one port) is output, as explained in more detail below.

In some embodiments, the circuit has two inputs for receiving a symmetrical signal and an output for outputting an asymmetrical signal. The first conduction path and the second conduction path are coupled on the output side.

If the conduction paths are connected in parallel on one side, a network having three ports is obtained. For a conversion from symmetrical to asymmetrical, the conduction paths are coupled on the output side. As a result, the port produced from the parallel circuit is referred to as the output, and the two other ports are referred to as the input.

Accordingly, for a conversion from asymmetrical to symmetrical, the conduction paths are coupled on the input side; thus, the port produced from the parallel circuit is referred to as the input, and the two other ports are referred to as the output.

On account of the purely passive structure of the balancing circuit, signals may also flow in the opposite direction, with the result that the terms "input" and "output" should be understood with respect to the signal flow.

The advantage of converting the symmetrical signals from a digital/analog converter (DAC) into asymmetrical signals by a simple and cost-effective arrangement of known circuit elements is provided. The circuit and method provided herein further provide the advantage of a ferrite-free arrangement, facilitating use of the circuit and method in magnetic resonance arrangements.

The first conduction path and the second conduction path have a second stage and a high-pass element that is assigned to the second stage and is arranged in a chain with the high-pass element assigned to the first stage. The second conduction path has a low-pass element that is assigned to the second stage and is arranged in a chain with the low-pass element assigned to the first stage. A wider bandwidth is achieved in the fields of application mentioned. A higher filter order is also achieved, enabling a stronger selection.

Alternatively, or additionally, the first conduction path and the second conduction path may form a third stage. As a result, a high-pass element is assigned to the third stage and is arranged in a chain with the high-pass elements assigned to the first and second stages. The second conduction path has a low-pass element that is assigned to the third stage and is arranged in a chain with the low-pass elements assigned to the first and second stages.

In each stage, the phase of a signal is shifted forward (e.g., in the leading direction) by a particular magnitude in the first conduction path. The phase of the signal is shifted backward (e.g., in the lagging direction) by a particular magnitude in the second conduction path. A degree of freedom is thus provided when dimensioning the circuit, allowing optimization of the requirements of the unbalancing process.

In this case, the first and second stages and/or the third stage of the first and second conduction paths form a two-stage or three-stage Boucherot bridge. A bandwidth is increased with each stage of the Boucherot bridge, making it possible to provide an MRI arrangement that is simultaneously suitable for multiple different field strengths.

On account of the type of circuit (e.g., symmetrical to asymmetrical), the input signal already consists of two parts, as is the case in a symmetrical signal. The input signal is divided between the two conduction paths. In this case, the already existing parts in a symmetrical signal are each assigned to a conduction path.

According to another embodiment, the first and second conduction paths are set up to match the input impedance of a signal to an output impedance.

As already explained above, matching of the impedance may be carried out in addition to the conversion from symmetrical to asymmetrical. For example, higher impedance may be at the input than at the output.

According to another embodiment, the high-pass elements are high-pass PI elements, and the low-pass elements are low-pass PI elements.

According to another embodiment, the first conduction path has N stages, and the second conduction path has N stages. Each stage of the first conduction path includes a high-pass element, and each stage of the second conduction path includes a low-pass element.

As explained above, each further stage increases the bandwidth. In addition, however, a bandpass filter effect that exists, for example, on account of the properties when using a Boucherot bridge is also enhanced with an increasing number of stages. This results in a degree of freedom that may be used to filter alias frequencies (i.e., alias frequency bands) in the field of application of magnetic resonance, for example.

According to another embodiment, each high-pass element has at least one capacitor and at least one coil, and each low-pass element has at least one coil and at least one capacitor.

The apparatus may also be advantageously developed with a bandpass filter device (e.g., a Cauer filter) connected to the first and second conduction paths.

According to another embodiment, the high-pass element of each stage is set up to shift the phase of the input signal forward by a predetermined magnitude, with the result that the sum of the phase shift in the first conduction path is approximately +90°.

According to another embodiment, the predetermined magnitude for each stage is 90°/N.

According to another embodiment, the low-pass element of each stage is configured to shift the phase of the input signal backward by a predetermined magnitude, with the result that the sum of the phase shift in the second conduction path is approximately −90°.

According to another embodiment, the predetermined magnitude is −90°/N.

In the method for converting a symmetrical input signal of a magnetic resonance arrangement into an asymmetrical output signal at the output of a digital/analog converter of the magnetic resonance device, at least one first conduction path and one second conduction path are connected downstream. The first conduction path and the second conduction path are arranged parallel to one another based on the signal flow. The first conduction path and the second conduction path form a first stage. The first conduction path has a high-pass element assigned to the first stage. The second conduction path has a low-pass element assigned to the first stage. Elements of the first stage are arranged in a chain. The first conduction path and the second conduction path form a second stage and have a high-pass element that is assigned to the second stage and is arranged in a chain with the high-pass element assigned to the first stage. The second conduction path has a low-pass element that is assigned to the second stage and is arranged in a chain with the low-pass element assigned to the first stage. Each high-pass element is configured to shift the phase of a signal forward by a predetermined magnitude, and each low-pass element is configured to shift the phase of a signal backward by a predetermined magnitude in order to generate an asymmetrical signal. The sum of the phase shifts in the first conduction path are approximately +90°, and the sum of the phase shifts in the second conduction path are approximately −90°. Two inputs for receiving a symmetrical signal are connected downstream of the output of the digital/analog converter such that a first input is assigned to the first conduction path and a second input is assigned to the second conduction path. An output for outputting an asymmetrical signal is formed such that the first and second conduction paths are coupled on the output side.

The scope of the present invention is defined solely by the appended claims and is not affected to any degree by the statements within this summary. The present embodiments may obviate one or more of the drawbacks or limitations in the related art.

DETAILED DESCRIPTION

In the figures, same or functionally same elements have been provided with the same reference symbols unless indicated otherwise.

Figure 1:
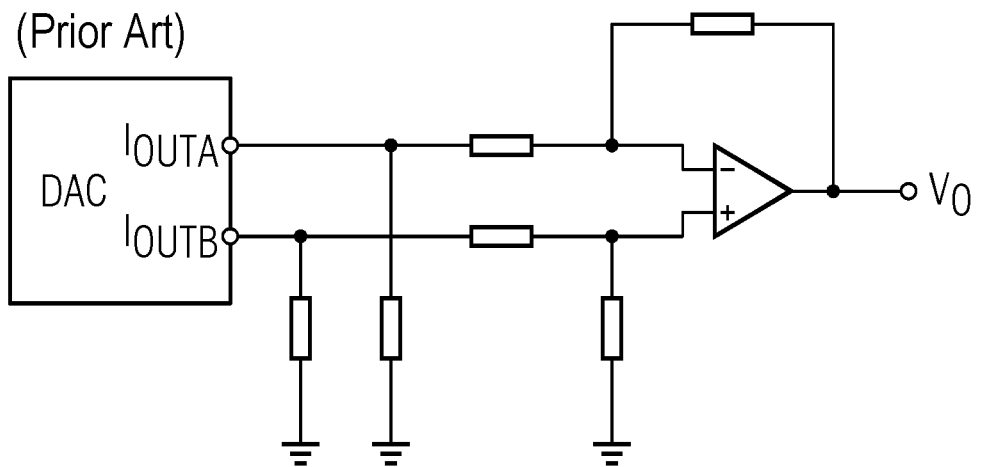
FIG. 1 is a schematic circuit diagram of unbalancing of signals from a digital/analog converter using an operational amplifier according to the prior art.

FIG. 1 illustrates a schematic circuit diagram 100 of unbalancing of signals from a digital/analog converter using an operational amplifier as an interface with DC voltage coupling and unbalancing with the aid of an operational amplifier, as is known according to the prior art.

Figure 2:
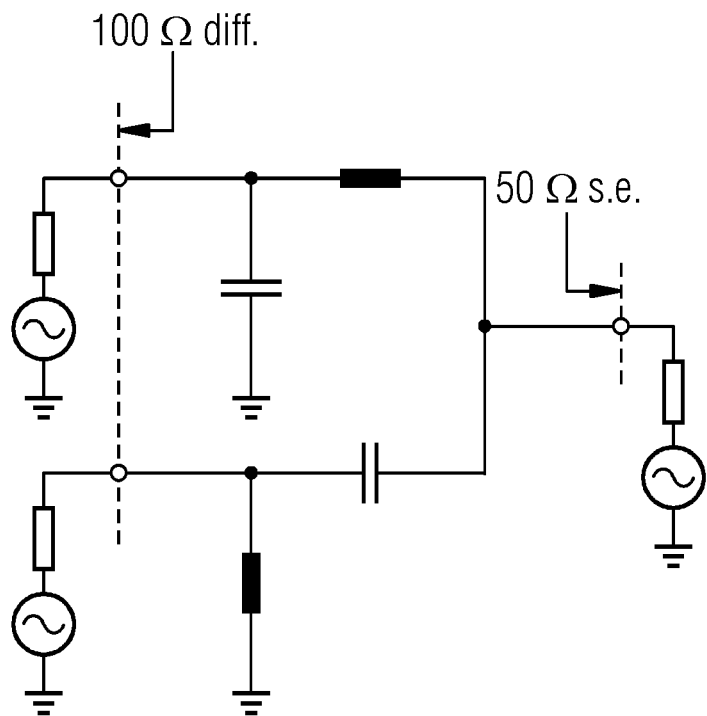
FIG. 2 is a schematic circuit diagram of an embodiment of the arrangement according to the invention for converting a symmetrical signal into an asymmetrical signal using a simple Boucherot bridge.

FIG. 2 is a schematic circuit diagram of an exemplary embodiment 200 of an arrangement for converting a symmetrical signal into an asymmetrical signal using a simple Boucherot bridge. In comparison with the operational amplifier with resistive feedback shown in FIG. 1, the FIG. 2 arrangement has the advantage, inter alia, of better noise properties. The FIG. 2 arrangement takes into account the very high signal dynamics in magnetic resonance arrangements by providing that the noise figure of the components to be used cannot significantly contribute to the total signal-to-noise ratio (SNR).

The structure and the effect of the circuit are as follows.

Port 1 201 produced by the parallel circuit is used as the output in this embodiment, and two other ports 2 202 and 3 203 are used as the input. On account of the purely passive structure, signals may also flow in the opposite direction, with the result that the terms "input" and "output" and the functions associated therewith may also be interchanged. However, for use in a magnetic resonance arrangement, a differential current output is unbalanced to form a "single-ended" output.

In this case, the Boucherot bridge is used to generate a symmetrical signal (also referred to as "differential" or "balanced to ground") from an asymmetrical signal (also referred to as "single ended" or "unbalanced to ground") and vice versa.

In most applications, the impedance of the symmetrical port 202, 203 is four times as high as the impedance of the asymmetrical port 201. However, both the first conduction path 220 and the second conduction path 210 may also be used in an impedance-transforming manner if necessary. Consequently, a Boucherot network 200 (e.g., Boucherot bridge) including two 100Ω conduction paths 210 and 220 would also match an asymmetrical source impedance with sources of 100Ω, for example, to a symmetrical 100Ω load. Each conduction path 210, 220 would therefore carry out a transformation from 100Ω "differential" to 50Ω "single ended".

Figure 3B:
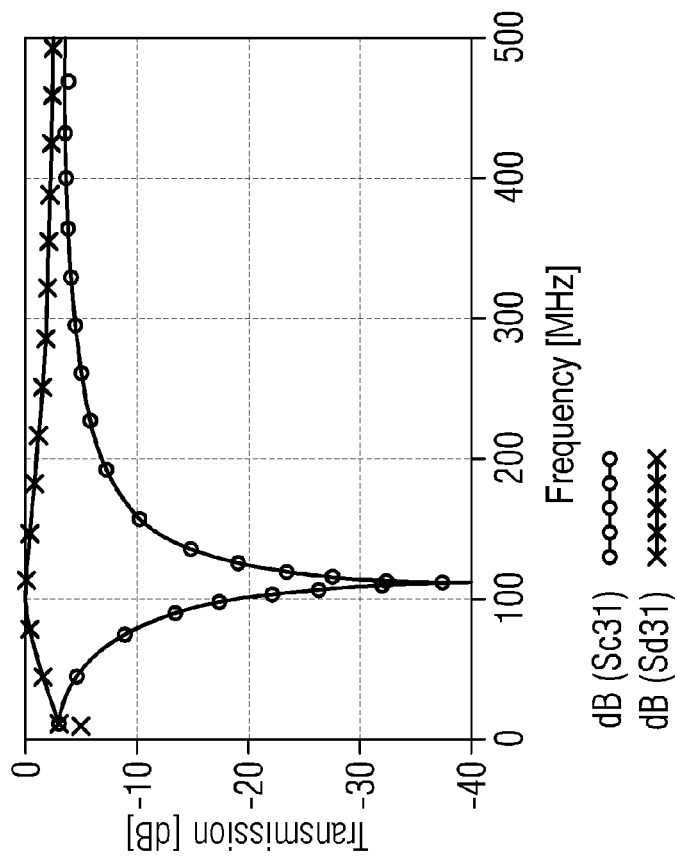
FIG. 3A-FIG. 3B depict graphs of the signal profile of the scattering parameters of the arrangement of FIG. 2.
Figure 3A:
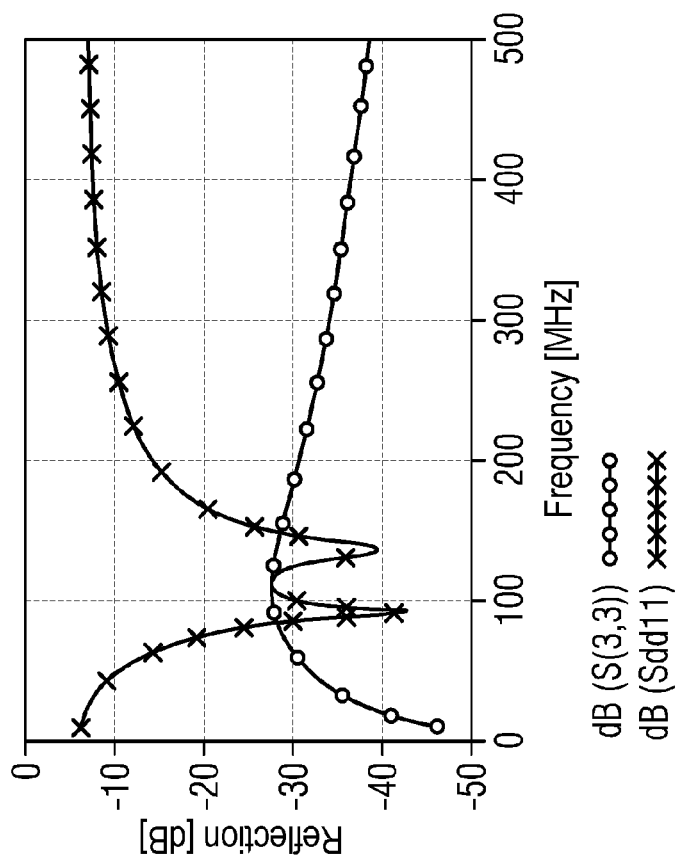

FIG. 3A-FIG. 3B illustrate graphs of the signal profile of scattering parameters (also "S parameters") for the arrangement from FIG. 2; the left-hand graph, FIG. 3A, depicts the reflection in dB based on the frequency of the input signal in MHz, and the right-hand graph, FIG. 3B, depicts the transmission in dB likewise based on the frequency of the input signal in MHz.

The embodiment 200 shown in FIG. 2 is still narrowband (e.g., with respect to the transmission $S_{d31}$ and common mode rejection $S_{c31}$). Restrictions result with regard to the use of conventional field strengths in the magnetic resonance arrangement. For example, the arrangement shown may not be simultaneously used at field strengths of 1.5 T corresponding to a signal frequency of 63.6 MHz and 3 T corresponding to a signal frequency of 123.2 MHz, as also illustrated by the scattering parameters in FIG. 3A-FIG. 3B.

Figure 4:
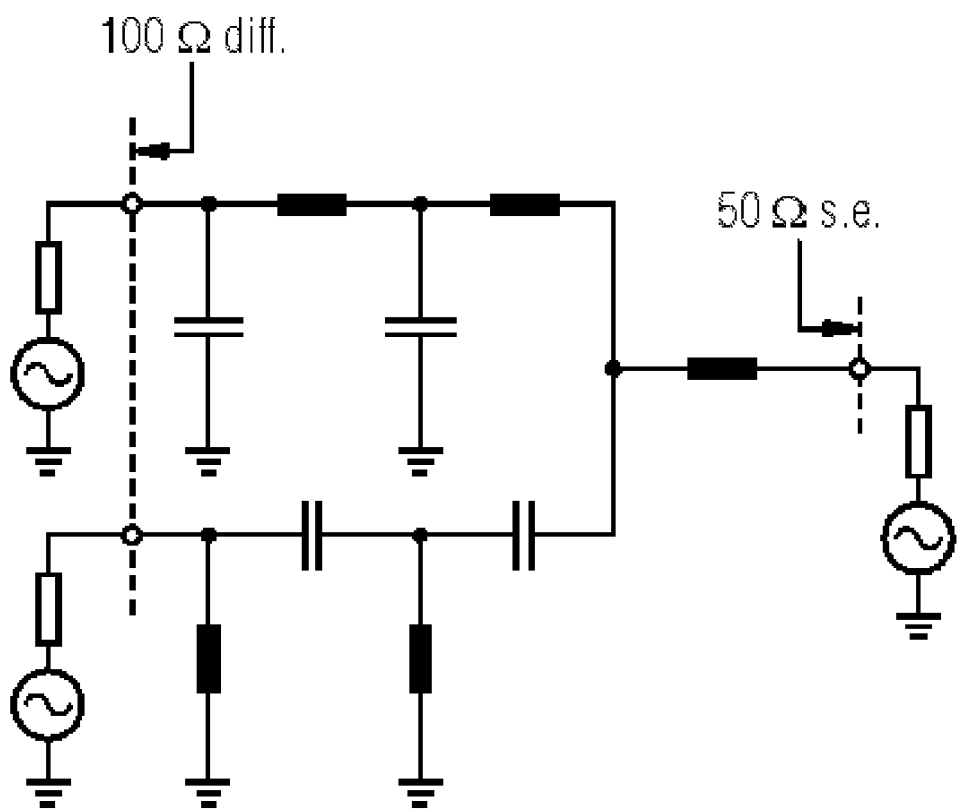
FIG. 4 is a schematic circuit diagram of a second embodiment for converting a symmetrical signal into an asymmetrical signal using a two-stage Boucherot bridge.

FIG. 4 is a schematic circuit diagram of a second embodiment 300 for converting a symmetrical signal into an asymmetrical signal using a two-stage Boucherot bridge. Conversion into the asymmetrical signal is carried out via a second stage, by "doubling" the elements L1, C1, L2, C2 of the simple Boucherot bridge that are shown in FIG. 1 and connecting the second stage L12, C12, L22, C22 on the conduction paths 210, 220 via an identical arrangement.

This two-stage embodiment and the coil A connected downstream of the two conduction paths 210, 220 for further matching, for example, of the impedances of the input and output achieve a considerably wider bandwidth and enable unbalancing in the frequency range of 60 MHz to 130 MHz without the previously explained restrictions (e.g., with respect to the standard field strengths mentioned (1.5 T and 3 T)).

Figure 5A:
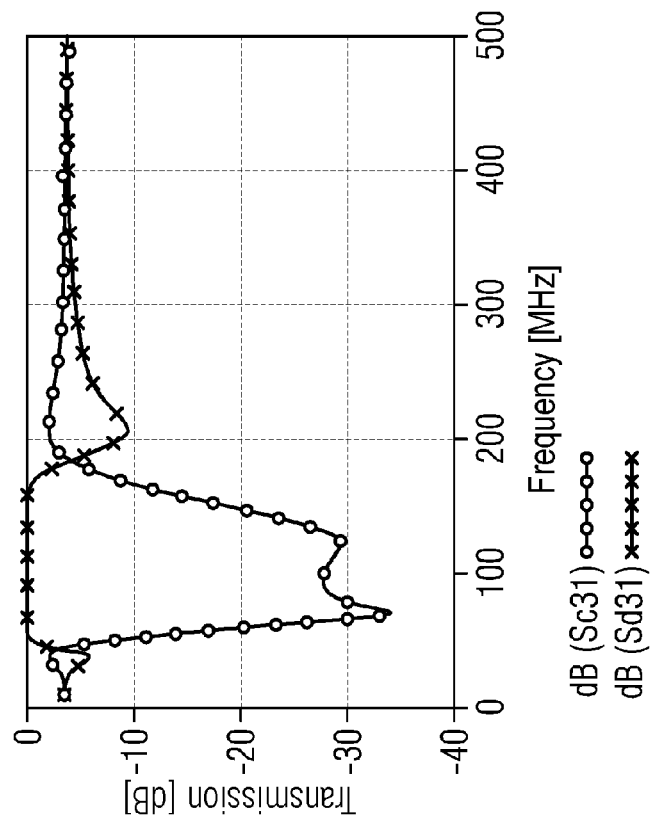
FIG. 5A-FIG. 5B depict graphs of the signal profile of the scattering parameters of the arrangement from FIG. 4.
Figure 5B:
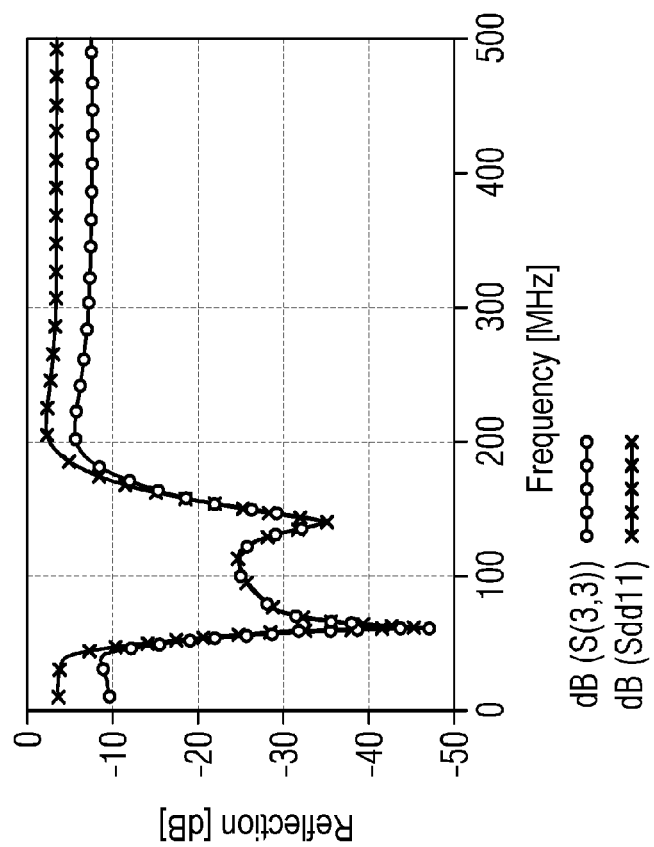

The graphs illustrated in FIG. 5A-FIG. 5B use the signal profiles of the scattering parameters of the arrangement from FIG. 4, which are now produced, for example, in the above-mentioned frequency range.

Figure 6:
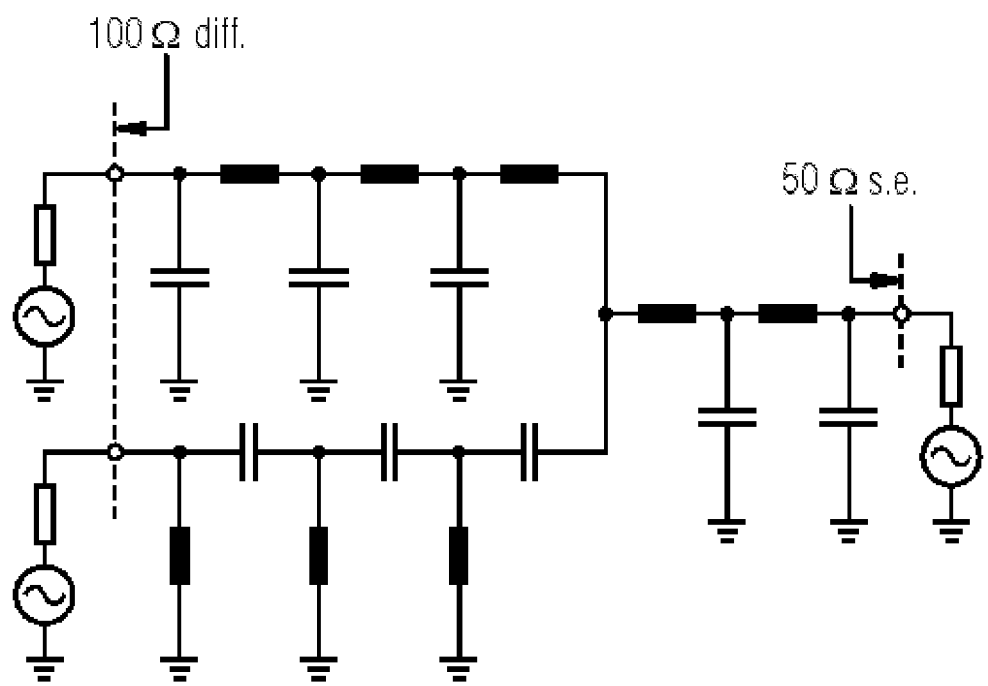
FIG. 6 is a schematic circuit diagram of a third exemplary embodiment for converting a symmetrical signal into an asymmetrical signal using a three-stage Boucherot bridge.

FIG. 6 is a schematic circuit diagram of a third exemplary embodiment 400 for converting a symmetrical signal into an asymmetrical signal using a three-stage Boucherot bridge. An advantage of this configuration is that further field strengths may be taken into account therewith since the bandwidth increases with each stage. However, a bandpass filter effect that is inherent in the Boucherot bridge also increases. Therefore, embodiments with additional stages are also provided for applications in which further deterioration in the common mode rejection is permissible. However, a balanced ratio prevails in this respect in the circuit shown and allows this three-stage Boucherot bridge to achieve an optimum performance without additional connection.

Figure 7A:
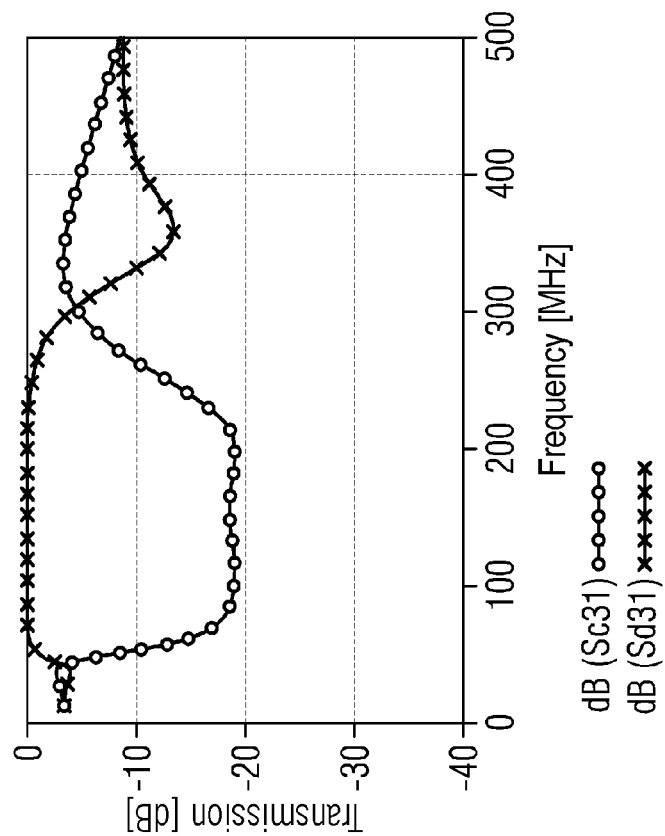
FIG. 7A-FIG. 7B depict graphs of the signal profile of the scattering parameters of the arrangement from FIG. 6.
Figure 7B:
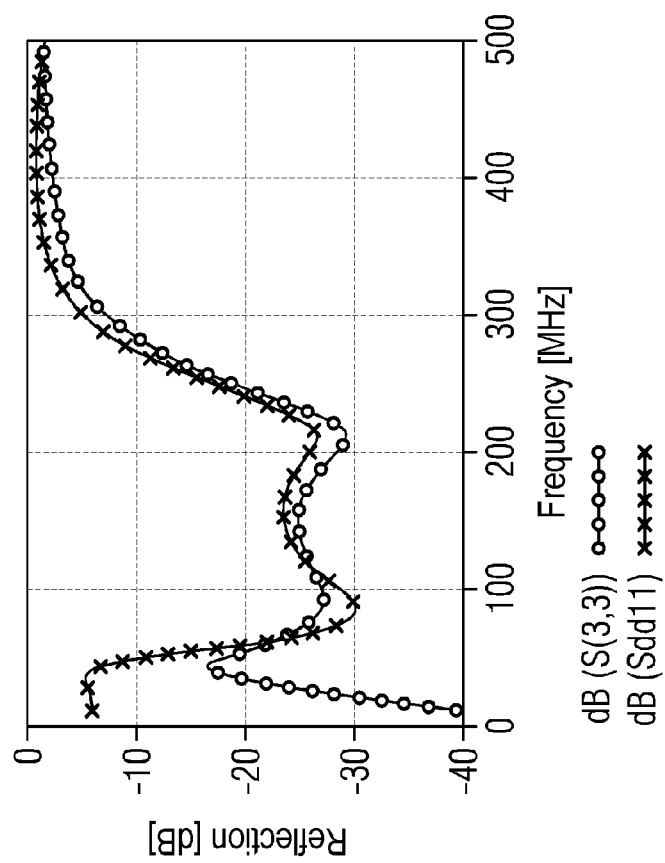

In this respect, FIG. 7A-FIG. 7B depict graphs of the signal profile of the S parameters of the arrangement from FIG. 6. As illustrated, the bandwidth is increased both in the transmission (FIG. 7B) and in the reflection (FIG. 7A) with the circuit shown in FIG. 6. The common mode rejection $Sc_{31}$ is changed from approximately −30 dB to −20 dB.

Figure 8:
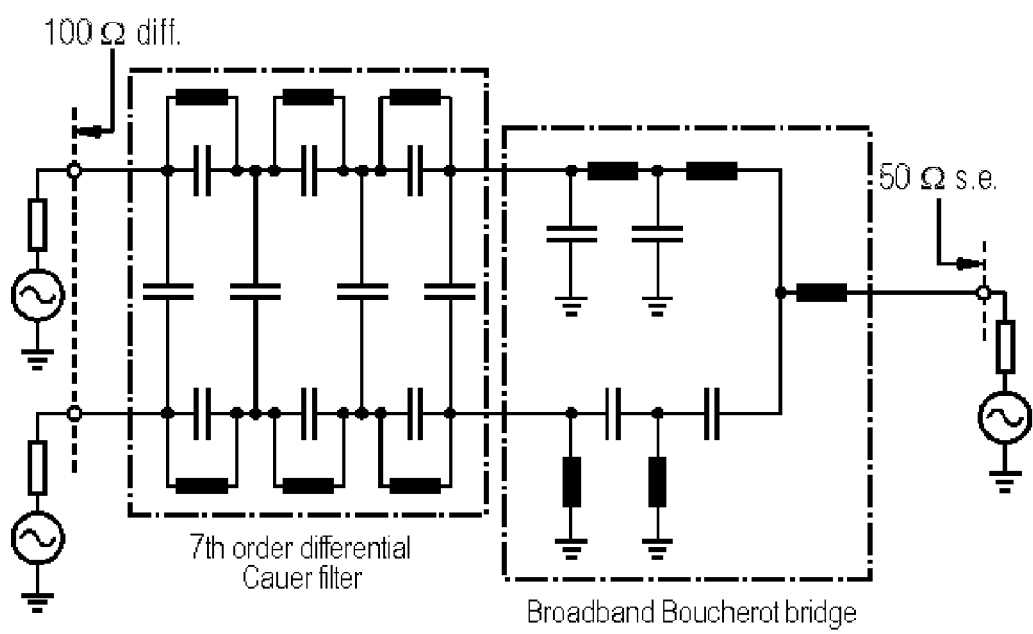
FIG. 8 is a schematic circuit diagram of a fourth exemplary embodiment for converting a symmetrical signal into an asymmetrical signal using a bandpass-optimized two-stage Boucherot bridge.

In order to avoid this disadvantage, for example, the two-stage circuit 300 shown in FIG. 4, as well as the other stage embodiments 200 and 400 described above, may be optimized with the aid of a BPF in the form of a Cauer filter, of the seventh order in the example. This results in the schematic circuit diagram of a fourth exemplary embodiment 500 for converting a symmetrical signal into an asymmetrical signal using a bandpass-optimized two-stage Boucherot bridge, as shown in FIG. 8.

One of the advantages of bandpass filtering is the filtering of alias bands that may result during operation of the magnetic resonance arrangement. For example, a first alias band is at $f_{max}$ of 195 MHz for a clock of 160 MHz and a maximum frequency $f_c$ of 125 MHz. For the unbalancing in this embodiment, low-pass filtering would be needed at the transmission frequency of $f_{max}$ and a minimum blocking frequency of $2f_c-f_{max}$.

Filtering of alias bands is advantageously achieved using an upstream bandpass filter, such as the Cauer bandpass filter in the example, which is connected upstream of the two-stage Boucherot bridge, since the unbalancing may now be carried out in a more exactly matched manner than without a bandpass filter (BPF) (e.g., filtering based only on the bandpass filter effect of the Boucherot bridge).

Advantages are provided by modifying and improving the Boucherot bridge known, e.g., from Bartlett, A. C.: "Boucherot's Constant-Current Networks and their Relation to Electric Wave Filters," Journal of the Institution of Electrical Engineers, 1927. Further advantages are provided by using the Boucherot bridge only in a broadband manner to unbalance digital/analog converter (DAC) output signals. As illustrated in FIG. 8, a corresponding low-pass filter produces an unbalancing circuit. The low-pass filter additionally filters the alias frequencies downstream of the DAC without causing noise and/or intermodulation as a result of the passiveness of the circuit. In addition, this circuit variant is very cost-effective, as are the previously shown variants as well, since all components used in the variant are inductances and capacitors costing only cents.

The provided circuit and method are thus advantageous over devices such as a specially developed air-core transformers. The provided circuit and method are further advantageous over active components (e.g., operational amplifiers) because no additional noise is added. Also, since only passive components are installed, no non-linearities are produced, with the result that the achievable signal dynamics are extremely high with the passive unbalancing of the provided circuit and method.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A circuit for converting a symmetrical signal into an asymmetrical signal, the circuit comprising:
    a first conduction path and a second conduction path being arranged parallel to one another based on signal flow, the first conduction path and the second conduction path having a first stage, a second stage, and a third stage,
        wherein the first conduction path comprises a first high-pass element assigned to the first stage, a second high-pass element assigned to the second stage, and a third high-pass element assigned to the third stage, the second and third high-pass elements being arranged in a chain with the first high-pass element,
        wherein the second conduction path comprises a first low-pass element assigned to the first stage, a second low-pass element assigned to the second stage, and a third low-pass element assigned to the third stage, the second and third low-pass elements being arranged in a chain with the first low-pass element,
        wherein each high-pass element is configured to generate a signal with a positive phase shift by a positive angle, and each low-pass element is configured to shift a phase of a signal backward by a predetermined magnitude to generate the asymmetrical signal, a sum of the phase shifts in the first conduction path being approximately +90°, and a sum of the phase shifts in the second conduction path being approximately −90°;
    two inputs for receiving the symmetrical signal, the two inputs configured such that a first input of the two inputs is assigned to the first conduction path and a second input of the two inputs is assigned to the second conduction path; and
    an output for outputting the asymmetrical signal, the output being formed such that the first conduction path and the second conduction path are coupled on an output side.

2. The circuit of claim 1, wherein the circuit is for a magnetic resonance arrangement.

3. The circuit of claim 1, wherein the symmetrical signal is an output signal from a digital/analog converter, and
    wherein the asymmetrical signal is a transmission signal of a magnetic resonance arrangement.

4. The circuit of claim 3, wherein the two inputs for receiving the symmetrical signal are two inputs for receiving the symmetrical signal downstream of the output of the digital/analog converter.

5. The circuit of claim 1, wherein (1) the first stage and the second stage, or (2) the first stage, the second stage, and the third stage of the first conduction path and the second conduction path provide a two-stage or a three-stage Boucherot bridge, respectively.

6. The circuit of claim 1, wherein a first half of power of an input signal is transmitted via the first conduction path, and wherein a second half of the power of the input signal is transmitted via the second conduction path.

7. The circuit of claim 1, wherein the first conduction path and the second conduction path match an input impedance of a signal to an output impedance.

8. The circuit of claim 1, wherein the first high-pass element and the second high-pass element are high-pass PI elements, and wherein the first low-pass element and the second low-pass element are low-pass PI elements.

9. The circuit of claim 1, wherein the first conduction path has N stages, and the second conduction path has N stages, and
wherein each stage of the N stages of the first conduction path includes a high-pass element, and each stage of the N stages of the second conduction path has a low-pass element, forming an N-stage Boucherot bridge.

10. The circuit of claim 1, wherein each high-pass element includes at least one capacitor and at least one coil, and
wherein each low-pass element has at least one coil and at least one capacitor.

11. The circuit of claim 1, further comprising a bandpass filter device connected to the first conduction path and the second conduction path.

12. The circuit of claim 11, wherein the bandpass filter device is a Cauer filter.

13. The circuit of claim 11, wherein each high-pass element is configured to shift the phase of the input signal forward by a predetermined magnitude, such that the sum of the phase shift in the first conduction path is approximately +90°.

14. The circuit of claim 13, wherein the predetermined magnitude for each stage is 90°/N.

15. The circuit of claim 11, wherein each low-pass element is configured to shift the phase of the input signal backward by a predetermined magnitude, such that the sum of the phase shift in the second conduction path is approximately −90°.

16. The circuit of claim 11, wherein the predetermined magnitude is −90°/N.

17. A method for converting a symmetrical input signal into an asymmetrical output signal for a magnetic resonance apparatus, the method comprising:
receiving an input signal at an output of a digital/analog converter of the magnetic resonance device, which comprises at least a first conduction path and a second conduction path connected downstream of the output of the digital/analog converter, wherein the first conduction path and the second conduction path are arranged parallel to one another based on signal flow, the first conduction path and the second conduction path having a first stage, a second stage, and a third stage, wherein the first conduction path comprises a first high-pass element assigned to the first stage, a second high-pass element assigned to the second stage, and a third high-pass element assigned to the third stage, the second and third high-pass elements being arranged in a chain with the first high-pass element, and wherein the second conduction path comprises a first low-pass element assigned to the first stage, a second low-pass element assigned to the second stage, and a third low-pass element assigned to the third stage, the second and third low-pass elements being arranged in a chain with the first low-pass element; and
generating the asymmetrical signal, the generating comprising shifting, by each high-pass element, a phase of the input signal forward by a predetermined magnitude, and shifting, by each low-pass element, the phase of the input signal backward by a predetermined magnitude,
wherein a sum of the phase shifts in the first conduction path is approximately +90°, and a sum of the phase shifts in the second conduction path is approximately −90°,
wherein two inputs for receiving the symmetrical signal are connected downstream of the output of the digital/analog converter such that a first input of the two inputs is assigned to the first conduction path and a second input of the two inputs is assigned to the second conduction path, and
wherein an output for outputting the asymmetrical signal is formed such that the first conduction path and the second conduction path are coupled on an output side.

* * * * *